(12) United States Patent
Anderson

(10) Patent No.: US 11,004,099 B2
(45) Date of Patent: May 11, 2021

(54) SYSTEM AND METHOD FOR PROVIDING A PRICE FOR A VEHICLE

(71) Applicant: Capital One Services, LLC, McLean, VA (US)

(72) Inventor: Jacob Anderson, Plano, TX (US)

(73) Assignee: Capital One Services, LLC, McLean, VA (US)

( * ) Notice: Subject to any disclaimer, the term of this patent is extended or adjusted under 35 U.S.C. 154(b) by 0 days.

(21) Appl. No.: 16/398,933

(22) Filed: Apr. 30, 2019

(65) Prior Publication Data

US 2020/0349595 A1    Nov. 5, 2020

(51) Int. Cl.
*G06Q 10/00* (2012.01)
*G06Q 30/02* (2012.01)
*G06F 30/20* (2020.01)
*G06F 16/2457* (2019.01)

(52) U.S. Cl.
CPC ......... *G06Q 30/0206* (2013.01); *G06F 30/20* (2020.01); *G06F 16/2457* (2019.01)

(58) Field of Classification Search
CPC .................................................. G06Q 30/0206
See application file for complete search history.

(56) References Cited

U.S. PATENT DOCUMENTS

| | | | | |
|---|---|---|---|---|
| 7,778,841 B1* | 8/2010 | Bayer | ............... | G06Q 10/00 705/29 |
| 8,595,079 B1* | 11/2013 | Raines | ............... | G06Q 30/0201 705/26.1 |
| 10,157,405 B1* | 12/2018 | Hopkins | ............... | G06Q 40/08 |
| 10,726,630 B1* | 7/2020 | Duckworth | ............. | G06F 30/20 |
| 2011/0022525 A1* | 1/2011 | Swinson | ............... | G06Q 30/02 705/306 |
| 2013/0006916 A1* | 1/2013 | McBride | ............ | G06Q 30/0629 706/52 |
| 2013/0030864 A1* | 1/2013 | Pollak | .................. | G06Q 10/087 705/7.29 |
| 2013/0204466 A1 | 8/2013 | Ricci | | |
| 2017/0061459 A1 | 3/2017 | Dow et al. | | |
| 2017/0316284 A1* | 11/2017 | Chang | .................. | G06K 9/6256 |

* cited by examiner

*Primary Examiner* — Hafiz A Kassim
*Assistant Examiner* — Scott M Ross
(74) *Attorney, Agent, or Firm* — Pillsbury Winthrop Shaw Pittman LLP

(57) ABSTRACT

System and methods for providing a target price for a target vehicle with a target mileage are provided. One exemplary method includes receiving attributes for the target vehicle, receiving prices for sold vehicles having attributes corresponding to the target vehicle attributes, and receiving mileages for the sold vehicles. The exemplary method may further include generating a linear regression model relating the sold vehicle mileages to the sold vehicle prices, and providing the target price for the target vehicle based on the model.

22 Claims, 11 Drawing Sheets

100

SYSTEM AND METHOD FOR PROVIDING A PRICE FOR A VEHICLE

TECHNICAL FIELD

The present invention generally relates to methods and systems for providing financial recommendations, and, more particularly for providing a price for a vehicle.

BACKGROUND

Buying a vehicle, such as a car, can be a stressful process. There are many different cars available with different attributes such as make, model, engine type, trim level, and prospective purchasers have numerous factors to consider when choosing a vehicle. The car buying process may be complicated when purchasing a used car. There are few standards available to determine the quality of used cars and to determine whether the price is reasonable. It is therefore often difficult to accurately compare different used cars.

Vehicle history reports may be used to determine additional information about a vehicle; however, these reports often provide a large amount of information that may further confuse a prospective buyer. Comparisons of multiple vehicle history reports can be a time-consuming process that may not result in information that can be useful for the prospective buyer.

Accordingly, there is a need for providing systems and methods that can assist potential buyers in comparing used vehicles, and in providing a recommended price for a used vehicle. The disclosed system and methods address the problems set forth above as well as other deficiencies in existing systems and methods.

SUMMARY

Disclosed embodiments provide systems and methods for determining the value of a vehicle and providing a recommendation for when to buy a vehicle.

Consistent with a disclosed embodiment, a method for providing a target price for a target vehicle with a target mileage is provided. The method may comprise receiving attributes for the target vehicle, receiving prices for sold vehicles having attributes corresponding to the target vehicle attributes, and receiving mileages for the sold vehicles. The method may further comprise generating a linear regression model relating the sold vehicle mileages to the sold vehicle prices, and providing the target price for the target vehicle based on the model.

Consistent with another disclosed embodiment, a method for providing a target price for a target vehicle with a target mileage is provided. The method may comprise receiving attributes for the target vehicle, and receiving a set of non-overlapping mileage ranges, the mileage ranges comprising mileage values within the mileage ranges and having bin labels, one of the mileage ranges containing the target mileage. The method may further comprise receiving sales data for sold vehicles having attributes corresponding to the target vehicle attributes, the sold vehicles having corresponding sold vehicle mileages, and associating bin labels with the sold vehicle sales data, a bin label being associated with a sold vehicle when a mileage of the sold vehicle is contained in a mileage range corresponding to the bin label. The method may further comprise selecting a target bin label with the mileage range containing the target mileage, and generating the target price for the target vehicle by computing an average price for the sold vehicles associated with the target bin label.

Consistent with another disclosed embodiment, a system for providing a target price for a target vehicle with a target mileage is provided. The system may comprise a database configured to store attributes for sold vehicles, and store mileages for the sold vehicles. The system may further comprise at least one memory storing instructions, and at least one processor executing the instructions to perform operations that may include receiving attributes for the target vehicle, and receiving prices for sold vehicles having attributes corresponding to the target vehicle attributes. The operations may further include receiving mileages for the sold vehicles, generating a linear regression model relating the mileages of the sold vehicles to the prices of the sold vehicles, and providing the target price for the target vehicle based on the model.

Consistent with other disclosed embodiments, memory device storing instructions may store program instructions, which are executed by at least one processor device and perform any of the methods described herein.

The foregoing general description and the following detailed description are exemplary and explanatory only and are not restrictive of the claims.

BRIEF DESCRIPTION OF THE DRAWINGS

The accompanying drawings are not necessarily to scale or exhaustive. Instead, the emphasis is generally placed upon illustrating the principles of the inventions described herein. These drawings, which are incorporated in and constitute a part of this specification, illustrate several embodiments consistent with the disclosure and, together with the detailed description, serve to explain the principles of the disclosure. In the drawings.

DETAILED DESCRIPTION

Reference will now be made in detail to exemplary embodiments, discussed with regards to the accompanying drawings. In some instances, the same reference numbers will be used throughout the drawings and the following description to refer to the same or like parts. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

The disclosed embodiments describe systems and methods for assisting a prospective buyer of a vehicle in determining the value of a used vehicle and for providing a recommendation for which used vehicle to buy. As used herein, unless otherwise noted, the term "vehicle" may include various types of vehicles. For example, a vehicle may include a car, a scooter, a bicycle, a motorcycle, a plane, a boat, a water scooter, or the like. In some cases, the disclosed embodiments, when applicable to the discussion, may relate to system and methods for assisting a prospective buyer in determining a value of the used equipment and for providing a recommendation what equipment to buy. In some embodiments, the equipment may include various tools (e.g., power tools, etc.).

Figure 1:
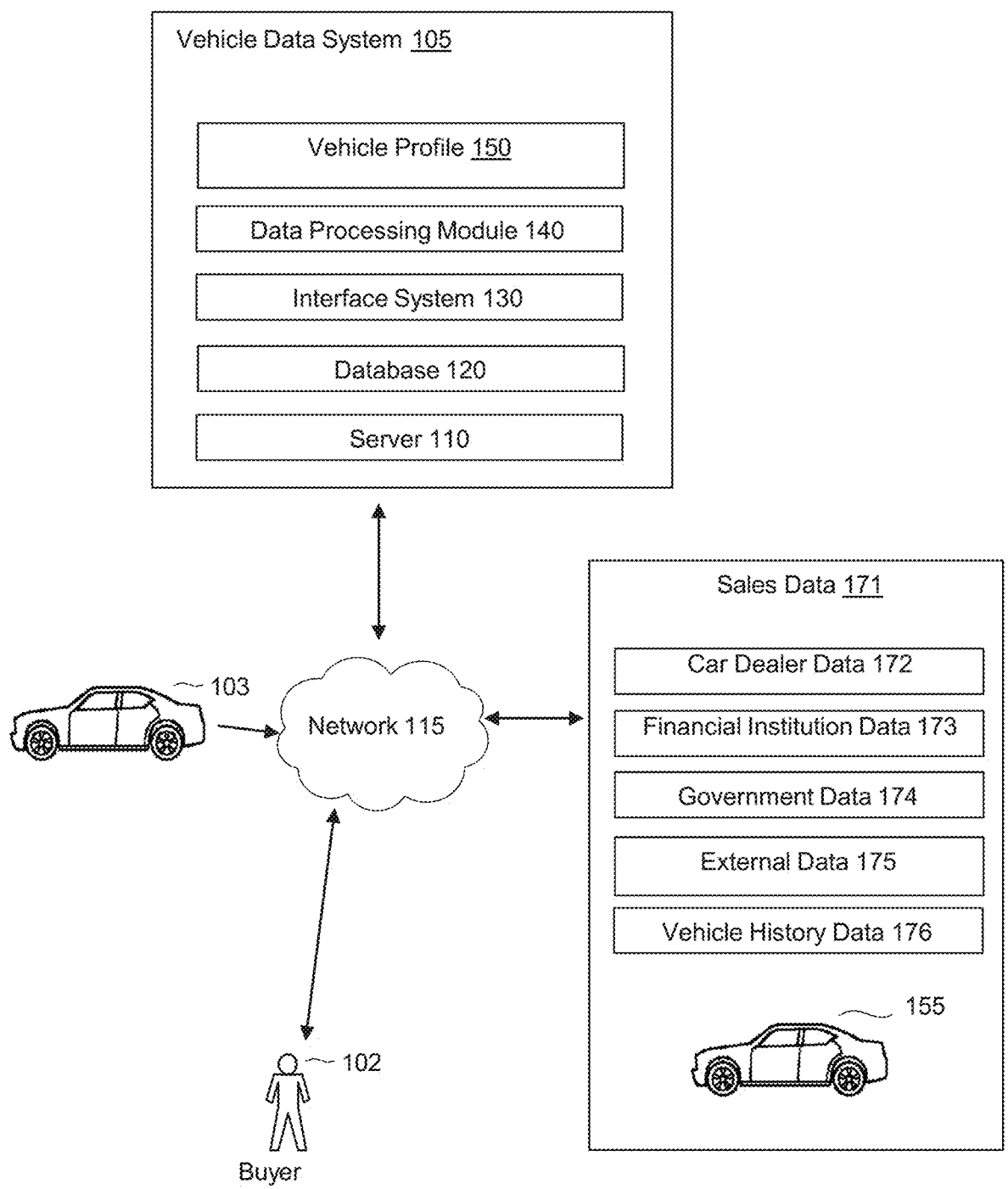
FIG. 1 is a diagram of an exemplary system for managing vehicle-related data consistent with disclosed embodiments.

FIG. 1 shows a system 100 consistent with embodiments of the present invention. In various embodiments, system 100 may be configured to collect and process vehicle data, receive inquiries about the vehicle data from prospective buyers, and communicate data for the requested inquiries to the prospective buyers. In some embodiments, system 100 may be provided by a third party for prospective buyers.

System 100 includes a vehicle data system 105 coupled through a network 115 to a prospective buyer 102 interesting in purchasing a target vehicle 103. System 100 may further include sales data (i.e., data related to sales of various previously sold vehicles) 171. Sales data 171 may include car dealer data 172 obtained from car dealers/car auctions or the like, as well as data 173 from financial institutions. Sales data 171 may also include government (e.g., Department of Motor Vehicles—DMV) data 174, external data 175, and vehicle history data 176 for previously sold vehicles 155.

System 100 may allow vehicle data system 105 to communicate with network 115 via a server 110, store data in a database 120, and process vehicle-related data via a data processing module 140. In various embodiments, system 100 may communicate with prospective buyer 102 through an interface 130. Vehicle data system 105 may include a computer-readable storage medium that can retain and store program instructions for execution by a processor.

The computer-readable storage medium may be, for example, but is not limited to, an electronic storage device, a magnetic storage device, an optical storage device, an electromagnetic storage device, or any suitable combination of the foregoing. A non-exhaustive list of more specific examples of the computer-readable storage medium may include a hard disk, a random-access memory (RAM), a read-only memory (ROM), an erasable programmable read-only memory (EPROM or Flash memory), a static random access memory (SRAM), a portable compact disc read-only memory (CDROM), a digital versatile disk (DVD), a memory stick, or/and the like.

Program instructions stored on a computer-readable storage medium may include assembler instructions, machine dependent instructions, firmware instructions, source code or object code written in any combination of one or more programming languages, including an object-oriented programming languages, procedural programming languages or functional programming languages. The programming language may be Fortran, Lisp, C++ or the like. The program instructions may be executed by a processor of the interaction system. In some embodiments, the program instructions may be executed by a processor of the user device, and in some embodiments, both the user device processor and the processor of the interaction system may execute program instructions.

In various embodiments, vehicle data system 105 may receive sales data 171 related to various vehicles via server 110 and store sales data 171 in database 120. In some embodiments, sales data 171 may include car dealer data 172. In some embodiments, car dealers may communicate car dealer data 172 voluntarily, and, in some embodiments, car dealer data 172 may be obtained by collecting information from a dealer's website which may be accessed over network 115. Collected sales data 171 may include pricing data, as well as data related to the year, make, model, trim line, mileage of the vehicle or the like. In some embodiments, sales data 171 may be collected from polling companies, inventory management companies or listing aggregators which may obtain and store inventory data from one or more of the dealers. Inventory polling companies, for example, are typically commissioned by the dealer to pull car dealer data 172 and format the data for use on websites; thus, inventory polling companies may contain all the necessary car dealer data 172 available from car dealers.

In various embodiments, vehicle data system 105 may receive financial institution data 173 related to sales data 171 for various vehicles. Financial institution data 173 may include data from entities such as banks, credit union, etc. that provide any type of financial services to a participant involved in the purchase of a vehicle. For example, when a buyer purchases a vehicle, the buyer may utilize a loan from a financial institution, where the loan process usually requires two steps: applying for the loan and contracting the loan. These two steps may utilize vehicle and consumer information in order for the financial institution to properly assess and understand the risk profile of the loan. Typically, both the loan application and loan agreement include proposed and actual sales prices of the vehicle. Vehicle data system 105 may be associated with a financial institution or any suitable third party that may provide vehicle data and/or computing services (e.g., Google, Amazon, etc.).

In various embodiments, vehicle data system 105 may receive government data 174 related to various vehicles. Government data 174 may be associated with sales data 171. Government data 174 may include any data related to a vehicle. For example, when the vehicle is purchased, it must be registered with the state (for example, DMV, Secretary of State, etc.) for tax and titling purposes. Government data 174 associated with such purchase typically include vehicle attributes (for example, model year, make, model, mileage, etc.) and sales transaction prices for tax purposes. In some embodiments, vehicle attributes may include additional vehicle characteristics such as the location of vehicle use, engine type, trim-line, the number of owners of the vehicle, vehicle gas efficiency, and/or the like. In some cases, additional vehicle characteristics for comparing two or more vehicles may include vehicle history reports listing vehicle maintenance procedures, vehicle repairs, vehicle accidents, vehicle repossession records and the like. In various embodiments, unless otherwise noted, when comparing target vehicle 103 with sold vehicles 155, vehicles with the same vehicle attributes are compared.

In some embodiments, system 105 may receive external data 175 related to sales data 171 for various vehicles 155. External data 175 may be obtained from various other information sources, online or otherwise, which may provide other types of desired data, such as data regarding location of vehicles, demographics at vehicle locations, current economic conditions, fuel prices, interest rates, and vehicle insurance rates that may influence current and future vehicle prices. In some embodiments, external data 175 may include data from manufacturers. In order to guide the pricing of their vehicles, the manufacturers may provide an invoice price and a manufacturer's suggested retail price (MSRP) for vehicles to be used as general guidelines for the dealer's vehicle price. These fixed prices may vary slightly by geographic region. In various embodiments, external data 175 for vehicle data system 105 may include vehicle-related data collected from various users driving a variety of vehicles.

In various embodiments, system 105 may receive vehicle history reports such as vehicle history data 176. For example, vehicle history data 176 may be obtained from services such as Carfax Inc. The vehicle history data may include a vehicle year, make, model, trim line, overall vehicle condition as determined by a party not interested in the sale of the vehicle (e.g., a professional technician hired to evaluate vehicle condition), number of owners, accident history, service history, registration history, open recalls and vehicle use (e.g., rental, fleet, personal). In some embodiments, history data for a vehicle may include historical data related to sales of the vehicle.

In some embodiments, vehicle data system 105 may obtain by gathering (or receiving) sales data 171 and vehicle history data 176. This data may include sales and historical data for a variety of vehicle configurations. Sales data 171 and vehicle history data 176 may be obtained at different time intervals, where the time interval utilized in any particular embodiment for a certain type of data may be based, at least in part, on how often that data is updated at the source, how often new data of that type is generated, an agreement between the source of the data and the providers of the vehicle data system 105 or a wide variety of other factors.

In various embodiments, system 105 may store vehicle-related data, such as vehicle attributes, in vehicle profile 150 for previously sold vehicle(s) 155. Vehicle profile 150 may use database 120 for maintaining the vehicle-related data. In some embodiments, vehicle profile 150 may include relevant information about vehicle 103 such as make, model, trim line, powertrain, options, geographical location, overall vehicle condition as determined by a mechanic, vehicle history, such as service history, as well as vehicle expected depreciation. As used herein, unless otherwise noted, the term "vehicle data" refers to any data that can be stored in vehicle profile 150 or database 120. In various embodiments, data associated with vehicles 105 may be presented to prospective buyer 102 through graphs or tables via interface system 130.

In various embodiments, vehicle data system 105 may include a data processing module 140, for data analysis and data manipulation. For example, data processing module 140 may determine if the obtained data is duplicative, falls within expected ranges, or/and conforms to expected values. In some embodiments, data processing module 140 may compare data for different vehicles and match data that correspond to the same vehicle. In an illustrative embodiment, data processing module 140 may obtain vehicle identifiable information (e.g., vehicle identification number (VIN)) and store all the related information for the vehicle associated with that vehicle identifiable information.

In various embodiments, data processing module 140 may be used to analyze and manipulate data stored in vehicle profile 150 or in database 120. For example, data processing module 140 may generate a price for target vehicle 103 as well as prices for similar vehicles that may be available for sale. In various embodiments, data processing module 140 may suggest prospective buyer 102 alternative vehicles that may provide buyer 102 more satisfaction than target vehicle 103. The data obtained by data processing module 140 through analysis of data in vehicle profile 150 and database 120 may be presented to prospective buyer 102 in a variety of ways via interface 130, such as through bar graphs, charts, tables, web pages or the like. In various embodiments, interface 130 may include, for example, a set of interactive web pages provided by vehicle data system 105.

In various embodiments, prospective buyer 102 may use interface 130 of system 105 to obtain various related information about vehicles 155 that prospective buyer 102 may consider purchasing. For example, using vehicle data system 105, prospective buyer 102 may specify a vehicle configuration by defining values for vehicle attributes (make, model, trim line, powertrain, options, etc.) and/or other relevant information such as a geographical location. Information associated with the specified vehicle configuration may include a price range of a possible target vehicle and the expected costs to own the target vehicle. This information may then be presented to prospective buyer 102 through interface 130.

Figure 2:
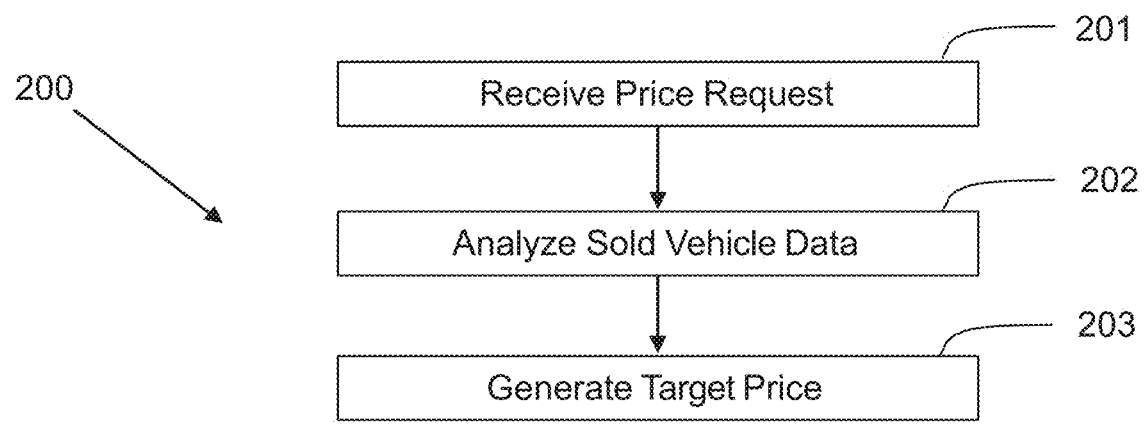
FIG. 2 is a flowchart of an exemplary process of generating a target price for a target vehicle, consistent with disclosed embodiments.

FIG. 2 shows an example process 200 of generating a target price for target vehicle 103 for prospective buyer 102. At a step 201, vehicle system 105 may receive a price request from prospective buyer 102 for target vehicle 103. For example, the price may be requested by prospective buyer 102 via interface 130. In some embodiments, at step 201, prospective buyer 102 may request a list of vehicles available for sale that matches the characteristics requested by prospective buyer 102. For example, prospective buyer 102 may request listings and prices of all vehicles for sale in a given area or location having a specific make, model, trim line, and mileage limitation. System 105 may present prospective buyer 102 with available vehicle choices, and prospective buyer 102 may select vehicle 103 from the list of choices. At a step 202, data processing module 140 of vehicle system 105 may analyze data for sold vehicles, and at a step 203 module 140 may generate a target price for prospective buyer 102. A statistical approach for analyzing data for sold vehicles and the use of computer-based models for determining the target price are described below.

Figure 3:
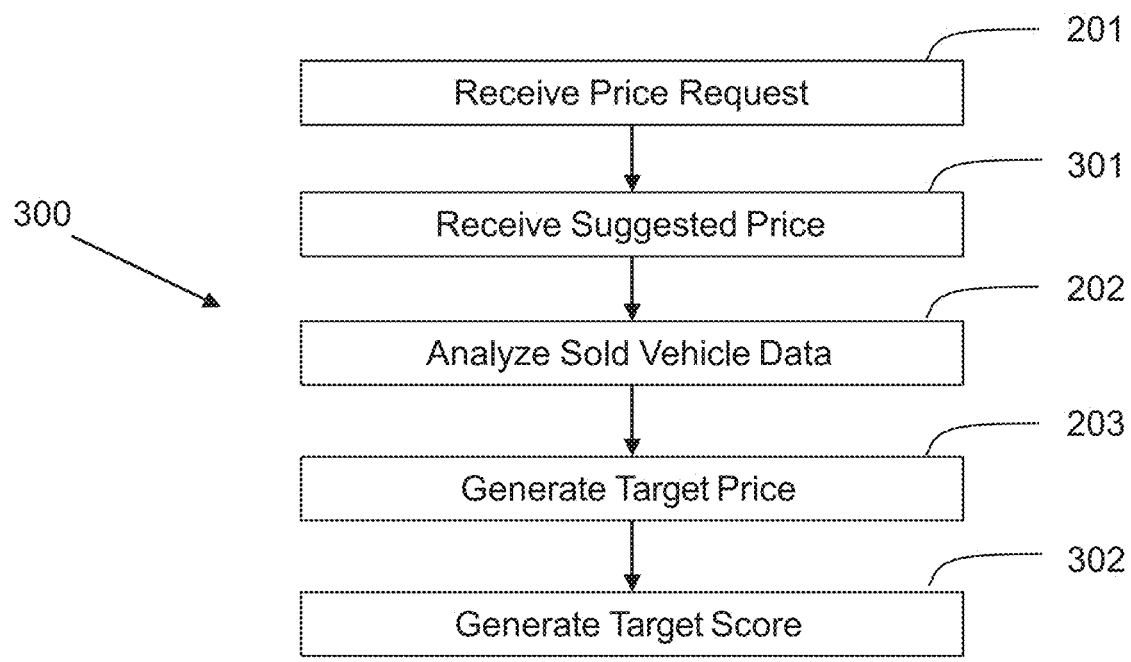
FIG. 3 is a flowchart of an exemplary process of generating a target score for a target vehicle, consistent with disclosed embodiments.

FIG. 3 shows a process 300 that may be similar to process 200. In an illustrative embodiment, process 300 includes a step 201 of receiving a price request from prospective buyer 102 following by a step 301 of receiving a suggested or offered price for target vehicle 103. The offered price may be the price offered by a dealership associated with vehicle 103. In an example embodiment, the offered price may include an offer for financing including available financing options. In some cases, the dealership may offer several prices, e.g., cash price, or price associated with different financing options. Following step 301, process 300 may proceed to steps 202 and 203 that are the same as the steps 202 and 203 of process 200. At a step 302, module 140 may compare the generated target price and the offered price and generate a target score.

In an example embodiment, the target score may be determined by computing the percentage difference between the target price and the offered price for target vehicle 103. For example, if the offered price is ten percent lower than the target price, vehicle system 105 may inform prospective buyer 102 that he/she is getting a great deal or low price (i.e., the target score is "great"), while if the offered price is ten percent higher than the target price the vehicle system 105 may inform prospective buyer 102 that he/she is getting a poor deal (i.e., target scores is "poor"). The choice of ten percent as a reference number for determining whether prospective buyer 102 gets a great deal or poor deal is only illustrative, and any other suitable reference number may be used. In some embodiments, the target score may include a numeric value (e.g., a value that ranges from 0 to 100), with a large score corresponding to a great deal and small score corresponding to a poor deal. For example, target score (TS) may be given by the expression: $TS = A \cdot \tanh(Bx+C)+D$, where the constants A, B, C, and D are selected as appropriate, and where x is a percentage difference between the target price and the offered price: $x = 100 \cdot (\text{target price} - \text{offered price})/(\text{target price})$. For instance, $TS = 50 \cdot \tanh(0.1x)+50$, may be used as a function for determining the target score.

Figure 4:
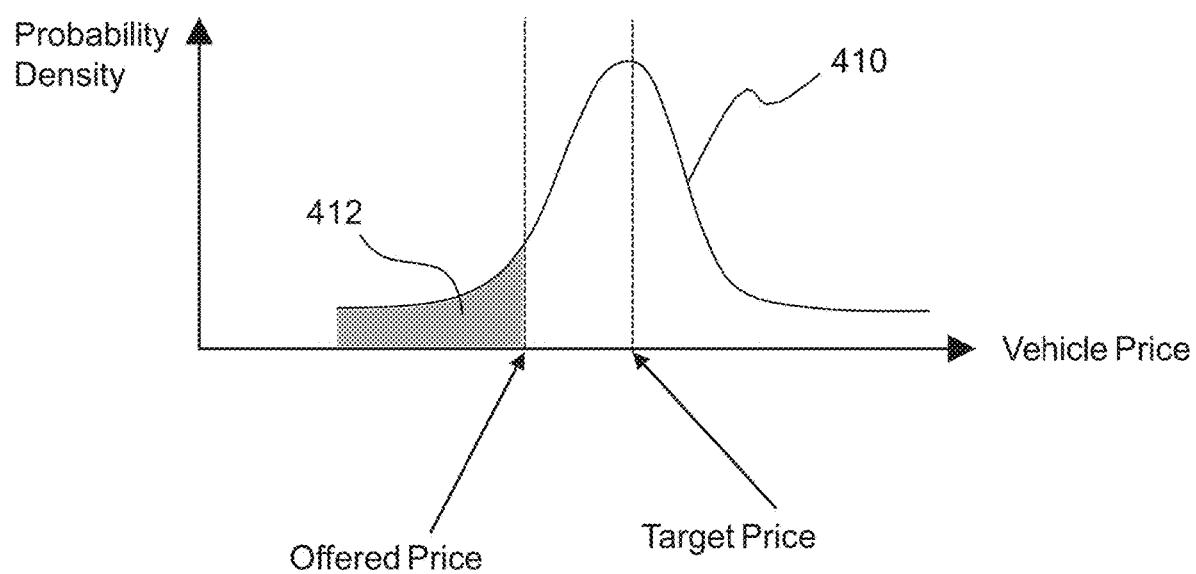
FIG. 4 is a graph illustrating the use of a probability density distribution for generating a target score consistent with disclosed embodiments.

Additionally, or alternatively, a percentage of buyers who bought a vehicle that is similar to target vehicle 103 (i.e., a vehicle that has the same vehicle attributes as target vehicle 103) at a lower price than offered price can be used as a target score. For example, FIG. 4 illustrates a probability density distribution 410 of prospective buyer 102 buying target vehicle 103 at a given price. Probability density distribution 410 may be based on previous sales of vehicles 155 that have the same attributes as target vehicle 103. Region 412 indicates the fraction of all buyers that are expected to purchase a vehicle that has attributes similar to that of target vehicle 103 at a price that is lower than the offered price. In an illustrative embodiment, the target score (TS) for the offered price (OP) may be calculated using probability density distribution 410 ($f$) as a function of vehicle price (p) as: $TS = 100 \times [1 - \int_0^{OP} f(p)dp]$. For example, if only five percent of buyers have bought a vehicle that has the same attributes as target vehicle 103 at a price that is lower than the offered price, then TS=95, and the offered price is in a top five percent of the best offered prices. In various embodiments, TS=80 to 100 may correspond to a great target score, TS=55 to 80 may correspond to a good target score, TS=45 to 55 may correspond to a fair target score, TS=20 to 45 may correspond to a low target score, and TS=0 to 20 may correspond to a poor target score. It should be noted that the use of probability density distribution 410 for calculating the target score is only one illustrative approach for calculating the target score and other suitable approaches may be used.

Figure 5:
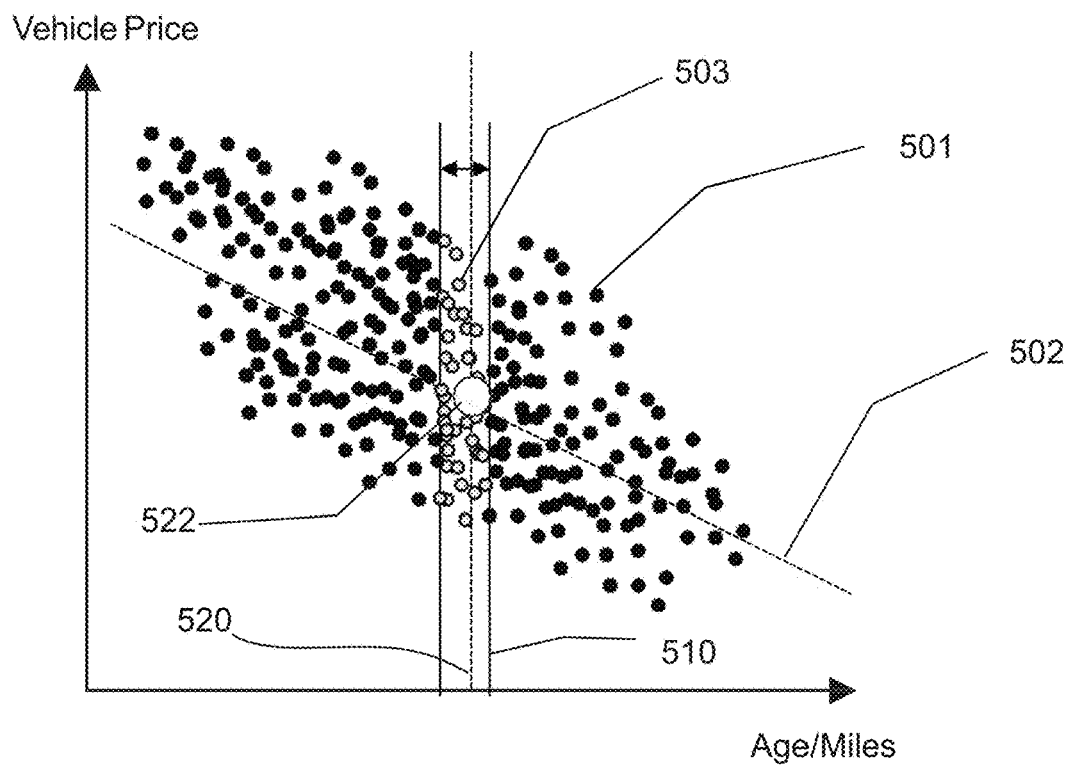
FIG. 5 is a graph illustrating vehicle price data and a linear regression graph as a function of a vehicle age (time) or miles traveled by a vehicle, consistent with disclosed embodiments.

A statistical approach for analyzing data for sold vehicles may include generating a linear regression model relating the sold vehicle mileage to the sold vehicle prices. FIG. 5 shows, for example, distribution of prices of sold vehicles 155 indicated by points 501 as a function of sold vehicle 155 mileage (or sold vehicle age). For a given mileage range (e.g., range 510 shown in FIG. 5), there may be multiple price data points 503 corresponding to various sold vehicles 155. A linear regression model may be used to obtain a linear regression plot 502 shown in FIG. 5. For a given target vehicle with a target mileage 520 a target price 522 may be determined using the linear regression plot 502 as shown in FIG. 5.

In various embodiments, data points 501 for sold vehicles 155 are selected to match target vehicle 103 attributes. In an example embodiment, the year, make, and model of sold vehicles 155 may be the same as the year, make, and model of target vehicle 103. In some embodiments, at least some of target vehicle 103 attributes may be the same as the attributes of sold vehicles 155. In some embodiments attributes of sold vehicles 155 and target vehicle 103 may include outward appearance and performance parameters, as well as any other observable vehicle parameters, such as, for example, audible sounds produced by vehicle 103 or vehicles 155. In some embodiments, a data filter may be applied to data related to sold vehicles 155 resulting in a subset of the data for sold vehicles 155.

As used herein, unless otherwise noted, the term "data filter" refers to a set of instructions for extracting a subset of a set of data (i.e., filtering data) based on characteristics contained in some of the data in the set of data. For example, a data filter based on a vehicle model being Toyota Camry (Toyota Camry is a characteristic that is used to filter the data related to sold vehicles 155), may filter data by extracting a subset of all sold vehicles 155 that are Toyota Camrys. It should be noted, that data filters are defined by characteristics that they use to filter a set of data. For example, one data filter may use vehicle make to filter data related to sold vehicles 155, and another data filter may use vehicle age to filter the data. In various embodiments, one or more data filters may be used to result in a subset of data.

Figure 6:
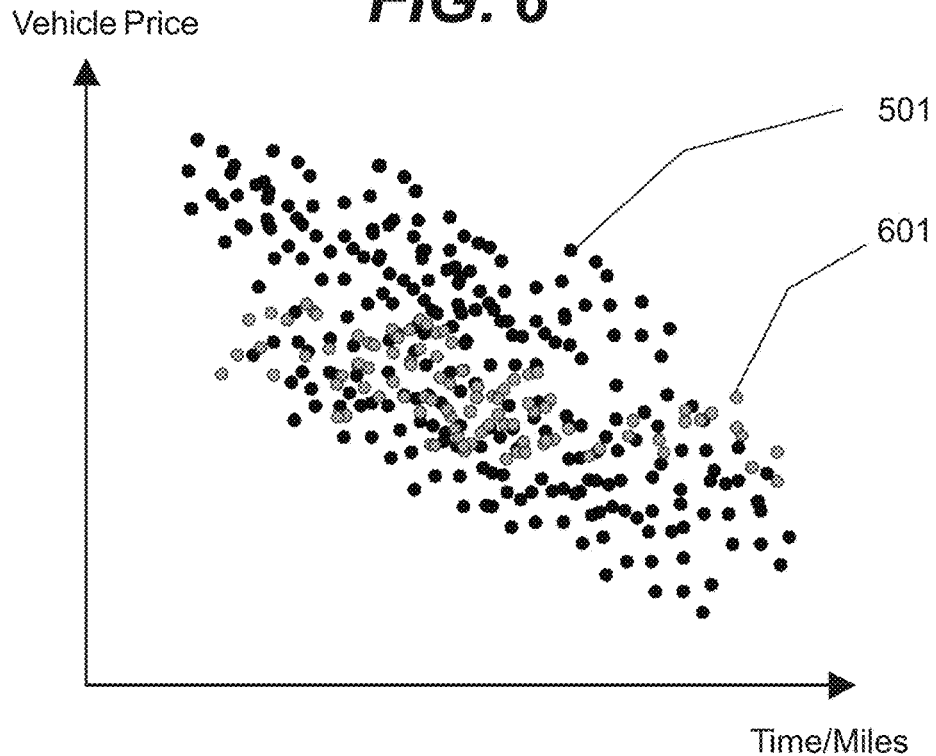
FIG. 6 is a graph illustrating vehicle price data with and without a data filter, consistent with disclosed embodiments.
Figure 7:
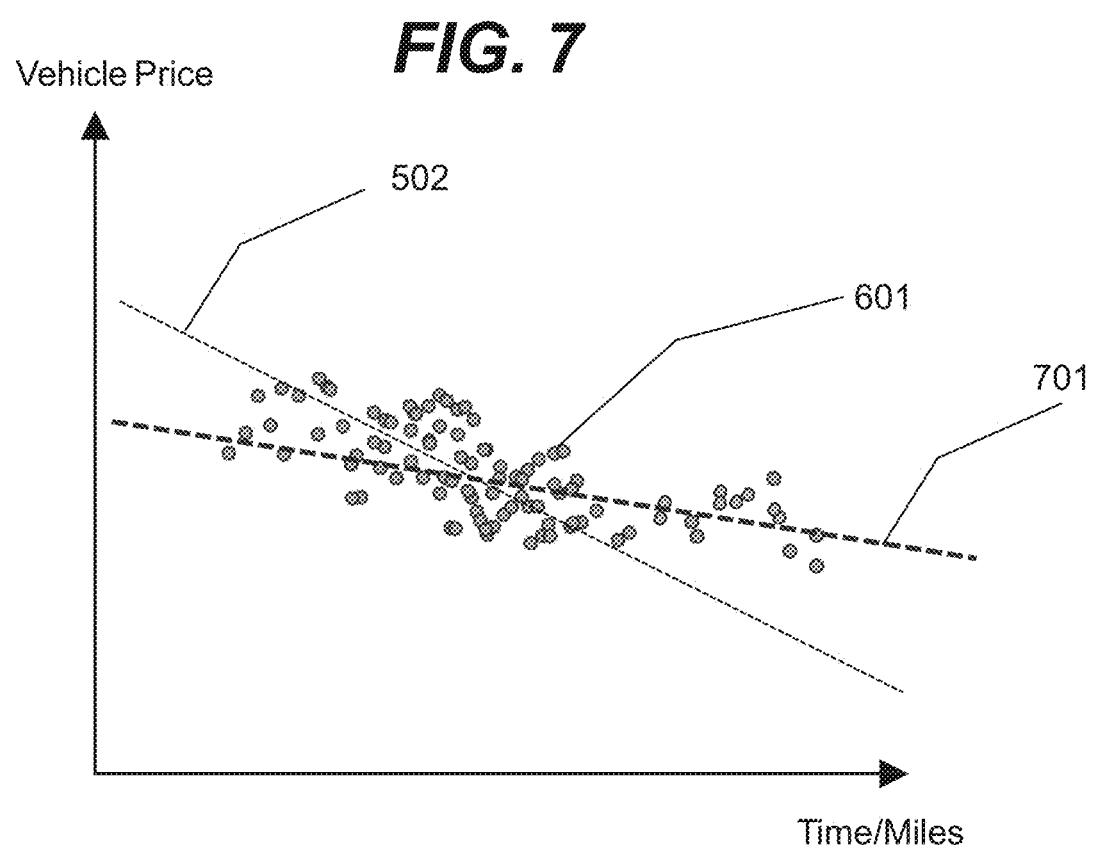
FIG. 7 is a graph illustrating filtered vehicle price data and linear regression graphs, consistent with disclosed embodiments.

FIG. 6 shows a subset of data points 601 for sold vehicles 155 extracted from data points 501. In some embodiments, only data points 601 may be used to construct a linear regression. For example, data points 501 may correspond to vehicles 155 with a set of attributes (e.g., make, model, trim, engine type, and age) that may be the same as the attributes of target vehicle 103, and data points 601 may correspond to vehicles 155 that have outward appearance that is similar to the outward appearance of target vehicle 103. Additionally, or alternatively, data points 501 may correspond to vehicles 155 with a set of attributes (e.g., make, model, trim, engine type, and age) that may be the same as the attributes of target vehicle 103, and data points 601 may correspond to vehicles 155 that have performance characteristics and/or audible characteristics that are similar to the performance characteristics and/or audible characteristics of target vehicle 103. FIG. 7 demonstrates that the linear regression model represented by linear regression plot 701 based on points 601 may be different from a linear regression model (represented by linear regression plot 502) that is based on a larger set of data points 501 (shown in FIG. 6).

In an example embodiment, outward appearance may be an important factor determining a target price of target vehicle 103, and effect of outward appearance on the target price may be analyzed by analyzing outward appearances of sold vehicles 155. In various embodiments, an image recognition engine may be used to analyze and compare outward appearances of various previously sold vehicles 155 to the outward appearance of target vehicle 103. In some embodiments, the image recognition engine may use images of vehicles captured by an image capturing system. The image capturing system may include a set of cameras and a lighting system (e.g., one or more light sources) for making an accurate visual representation of vehicle 103. In some embodiments, the image capturing system may include a computer system for controlling the lighting sources as well as the cameras. In an example embodiment, the computer system may change brightness, duration and the wavelength of the light sources, positions of the light sources, positions of the cameras, orientations of the cameras, photograph's exposure for the one or more cameras, and/or the like. In various embodiments the computer system may communicate power and data through various electrical connections to the cameras and the light sources. In various embodiments, the computer system may include a user interface for setting up parameters controlling the capturing of images of vehicle 103, such as the brightness, the duration and the wavelength of the light sources, the positions of the light sources and the cameras, and the like.

In an example embodiment, the image capturing system is configured to take images of vehicle 103 under standardized conditions. For example, vehicle 103 may be photographed at a set of specific angles, at a set of specific lighting conditions, by the cameras positioned and oriented at a set of predetermined locations and angles and the like. In various embodiments, the image capturing system may be configured to capture a set of images for a set of system parameters that are the same from one sold vehicle to another sold vehicle.

In various embodiments, target vehicle 103 may be photographed using the image capturing system, and a set of images corresponding to target vehicle 103 may be stored in the database 120 of vehicle system 105 corresponding to target vehicle profile 150. Similarly, the image capturing system may be used to capture images for sold vehicles 155 and store them in database 120 corresponding to sold vehicle profiles 150. In an example embodiment, a computer-based model may be used to evaluate a set of images for sold vehicle 155 and determine if sold vehicle 155 matches the outward appearance of target vehicle 103. For example, the computer-based model may return a match score determining the degree to which the outward appearance of sold vehicle 155 matches the outward appearance of target vehicle 103. For example, the match score may range from zero to hundred with hundred corresponding to a perfect match and zero corresponding to poor match. In an example embodiment, data 601 shown in FIGS. 6 and 7 may correspond to a match score that is between 80 and 100. It should be understood, that any suitable match score range can be used to filter data 501 and obtain data 601.

Figure 8:
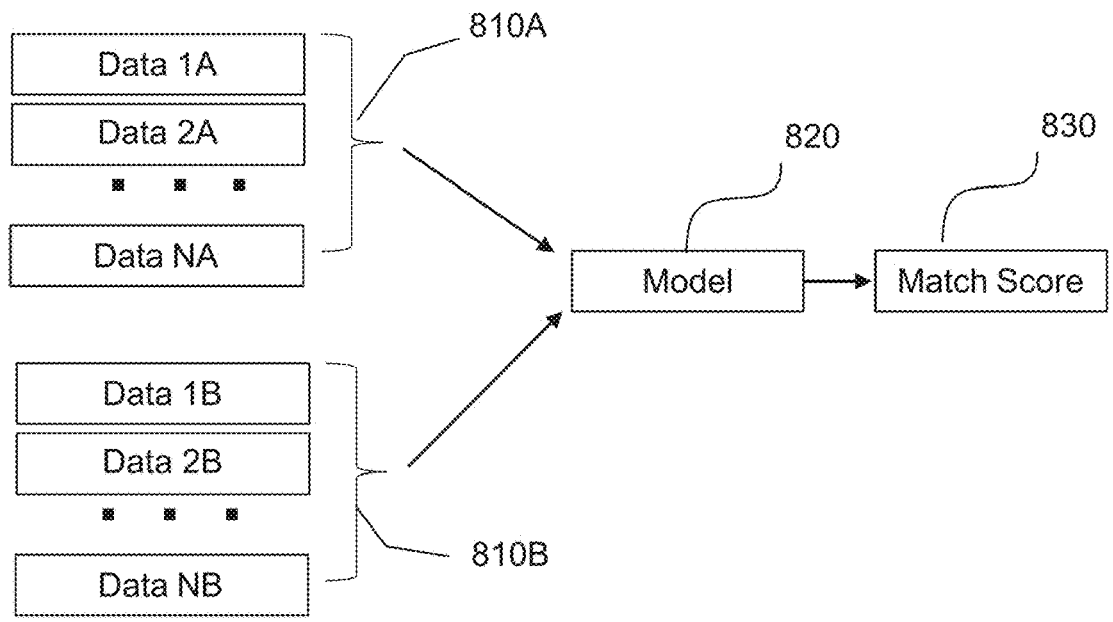
FIG. 8 is a diagram of an illustrative computer-based model for obtaining a match score for a vehicle, consistent with disclosed embodiments.

FIG. 8 shows an exemplary process of obtaining a match score 830 relating sold vehicle 155 to target vehicle 103 using a model 820 for image data 810A and 810B. Image data 810A for sold vehicle 155 may include multiple images denoted by Data 1A through Data NA, while image data 810B for target vehicle 103 may include multiple images denoted by Data 1B through Data NB. In various embodiments, match score 830 may be calculated using model 820 that may include machine-learning models, such as neural networks, decision trees, and models based on ensemble methods, such as random forests. The machine-learning models may have parameters that may be selected for optimizing the performance of model 820. For example, parameters specific to a particular type of model (e.g., the number of features and number of layers in a neural network) may be optimized to improve the model's performance. In some embodiments, as shown, for example, in FIG. 8 model 820 may return a match score 830 indicating the match in the outward appearance of vehicles that are compared by model 820 characterized by a single number in a range of zero to hundred.

In some embodiments, model 820 may provide two match scores 830—one match score for the interior of the vehicles (e.g., the match score indicating the match in the appearance of the interior of the compared vehicles) and another match score for the exterior of the vehicles. In some embodiments, more than two match scores may be provided by model 820. For example, a first match score may be generated for the trunk section of the compared vehicles, a second match score may be generated for the engine region of the vehicles, a third match score may be generated for the interior of the vehicles, a fourth match score may be generated for the exterior of the vehicles, and a fifth match score may be generated for the chassis of the vehicles that may be photographed using one or more cameras located underneath the compared vehicles. For example, cameras may be installed on a platform 803 of the system 800 shown in FIG. 8.

In various embodiments, cameras 801A-801B of system 800 may use a wavelength of light that may be best suitable for detecting vehicle-related problems. In an example embodiment, cameras 801A-801B may use ultraviolet light to detect problems related to paint and rust of the vehicle body. In some embodiments, ultraviolet light can be used to detect stains in the interior of the vehicle. Infrared (IR) wavelength can be used to obtain an infrared image of the engines of sold vehicles 155 as well as images of the engine of target vehicle 103 during operation of the engine, and/or during engine cooling. In some embodiments, sequences of IR image data taken at different times (during the engine operation and cooling) may be used as Data 1A through Data NA for determining match score 830.

In various embodiments, model 820 may be specific to a particular vehicle type. For example, one computer-based model may be trained to generate a match score for 2011 Toyota Camry XLE vehicles, and another computer-based model may be trained to generate a match score for 2018 Ford F-150 XL with a regular cab style. Additionally, or alternatively, one computer-based model may be trained to generate a match score for the interior of the compared vehicles, and another computer-based model may be trained to generate a match score for the exterior of the compared vehicles.

In various embodiments, model 820 may be trained using a training data set containing training data records. For example, a training data record for training a machine-learning model 830 may include Data 1A through Data NA (e.g., image data) for a first vehicle, Data 1B through Data NB for a second vehicle, and a match score for the first and the second vehicle.

Figure 9:
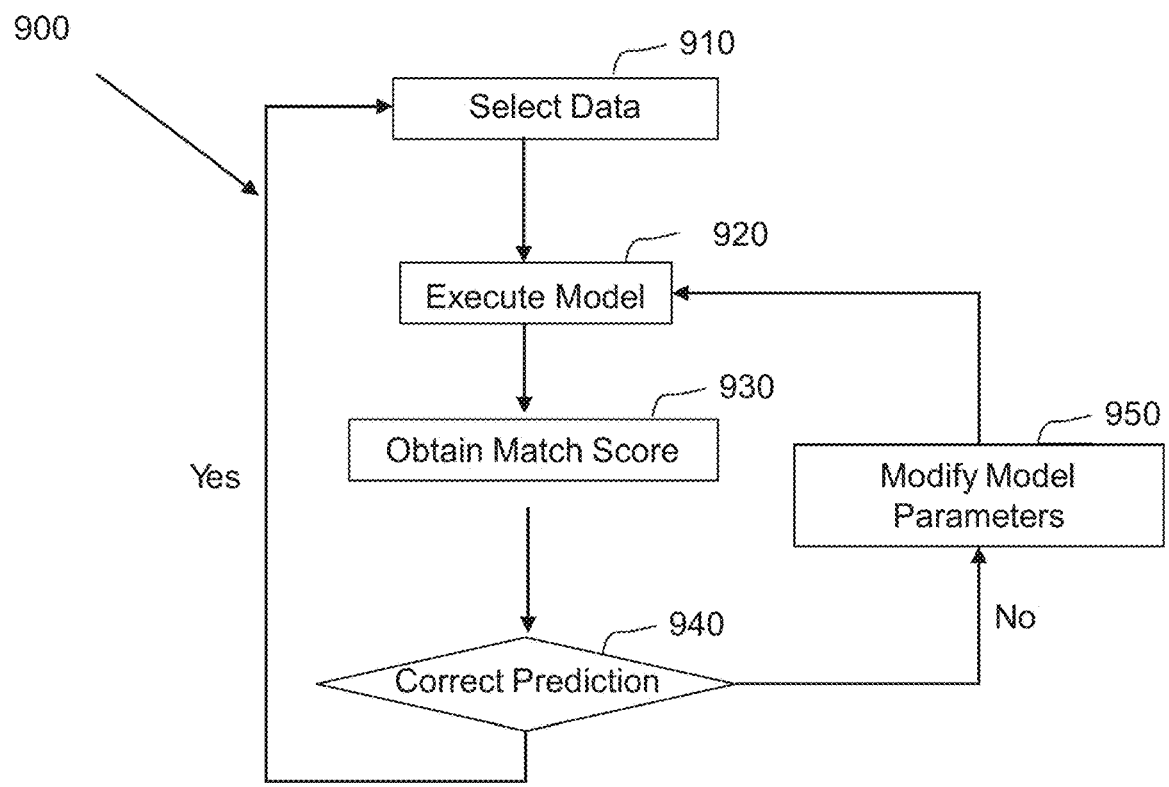
FIG. 9 is a flowchart of an exemplary process of training computer-based models, consistent with disclosed embodiments.

FIG. 9 shows an example embodiment of a process 900. At step 910, training data is selected for training a machine learning model, such as model 820. In various embodiments, the training data may be related to a vehicle with particular vehicle attributes. In various embodiments, training data may include multiple data records, with each record processed consecutively by model 820. At step 910 of process 900, model 820 may acquire a training data record, at a step 920 perform computations, and at a step 930 return a predicted match score of the vehicles used for the training data record. In various embodiments, the predicted match score may be compared with the match score contained in the training data record to evaluate an associated error for model 820 at a step 940. If the error is below the threshold value (step 940, NO), process 900 may proceed to step 910 of acquiring a next training data record. If the error is above the threshold value (step 940, YES), process 900 may proceed to a step 950 of modifying model parameters and subsequently returning to step 920. In various embodiments, model 820 may be rated based on the average error generated by model 820.

An outward appearance of a vehicle may be one of the factors that differentiate the price of vehicles having otherwise the same attributes such as make, model, trim, year, mileage, engine type, number of owners, the location of vehicle use, number and type of accidents, etc. In an illustrative embodiment, data processing module 140 may, for a target vehicle 103, obtain a subset of vehicle data related to sold vehicles for sold vehicles with a match score in a specific range. For example, data 601 may be a subset of data 501 as shown in FIG. 6, when a match score for sold vehicles represented by data points 601 is within a range of 80 to 100. The choice for the range above is only illustrative, and any other suitable range may be used.

In various embodiments, vehicle parameters other than the vehicle outward appearance may be used to differentiate between the vehicles that have otherwise the same attributes, and similar outward appearance. In an example embodiment, such parameters may correspond to vehicle performance parameters that may be evaluated during vehicle testing. In an example embodiment, performance parameters may include vehicle acceleration and vehicle breaking, audio sounds emitted by the engine of a vehicle, vehicle vibration, and the like. In various embodiments, collected data related to the performance parameters (also referred to as vehicle-related performance data) may be used as input data to model 820 shown in FIG. 8. For example, vehicle acceleration data may be used as Data 1A, and vehicle vibration data may be used as Data 2A. In various embodiments, vehicle-related performance data for sold vehicle 155 may be used additionally or alternatively as the input data to model 820, provided that the same data is available for target vehicle 103 as Data 1B, Data 2B and so on. Various vehicle-related performance data may be used to differentiate between the vehicles that have otherwise the same attributes and similar outward appearance.

In an illustrative embodiment, data processing module 140 may, for vehicle 103, obtain a subset of vehicle data related to sold vehicles for sold vehicles with a match score of performance data is in a specific range. For example, data 601 may be a subset of data 501 as shown in FIG. 6, when a match score for sold vehicles represented by data points 601 is within a range of 80 to 100. It should be noted that the choice for the range above is only illustrative and any other suitable range may be used. In some embodiments, a match score may be a structure having a plurality of scores. For example, a match score may include a first score indicating a match in visual appearance for vehicle 103 and sold vehicle 155, and a second score indicating a match in performance for vehicle 103 and sold vehicle 155. In some embodiments, the first score may be a structure of several sub-scores. For example, a first sub-score of the first score may indicate a match in external visual appearance for vehicle 103 and sold vehicle 155, and a second sub-score of the first score may indicate a match in visual appearance of vehicle's interior for vehicle 103 and sold vehicle 155. Similarly, the second score may be a structure of several sub-scores. For example, a first sub-score of the second score may indicate a match in performance of an engine for vehicle 103 and sold vehicle 155, and a second sub-score of the second score may indicate a match in performance of brakes for vehicle 103 and sold vehicle 155. In some embodiments, a single number representing an average match score may be calculated as a weighted average of various scores and sub-scores forming structure of the match score, wherein weights may be chosen by perspective buyer 102. For instance, for a match score MS={FS={ms11, ms12}, SS={ms21, ms22}}, where MS—match score structure, FS—first score structure, SS—second score structure, and ms11 through ms22 are various sub-scores, the average match score may be calculated as $AMS=\Sigma_{i=\{1,2\},j=\{1,2\}}(w_{ij}ms_{ij})$, where are the weights for the weighted average that may be selected by perspective buyer 102.

Figure 10:
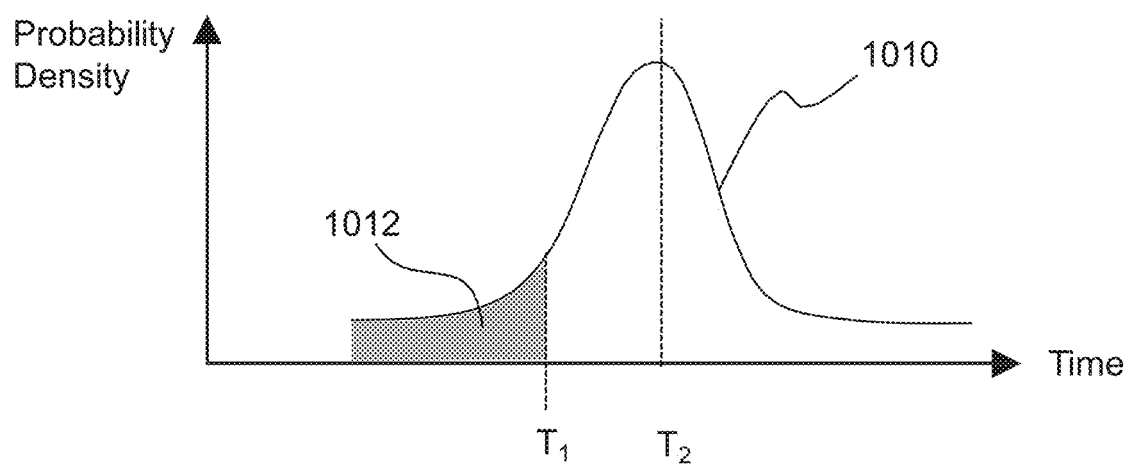
FIG. 10 is a graph illustrating the use of a probability density distribution for generating a vehicle quality score consistent with disclosed embodiments.

A reported history may be another factor that may differentiate vehicles with otherwise similar vehicle attributes. In an example embodiment, a vehicle quality score may be assigned to target vehicle 103 and sold vehicles 155, by analyzing the reported history of vehicle 103 and vehicles 155. The vehicle quality score may be used as a filtering characteristic for a data filter to generate subset data for data related to sold vehicles 155. For example, a prospective buyer may be interested in buying a first Toyota Corolla that is reported to have two minor accidents, that has been registered in Delaware, Tex., and New Jersey, and that was regularly maintained. Alternatively, prospective buyer 102 may be interested in buying a second Toyota Corolla that is reported to have no accidents, that has been registered in Virginia, driven in a rural area, and has no maintenance records. In an illustrative embodiment, data processing module 140 may be configured to process reported history for each vehicle (e.g., the first and the second Toyota Corolla) and assign to each vehicle a vehicle quality score that indicates a probability that the prospective buyer is not going to dispose of the vehicle for a specified duration of time. For example, module 140 may assign a first vehicle quality score that prospective buyer 102 is not going to dispose of vehicle 103 for the first year, a second/third/fourth/fifth vehicle quality score that prospective buyer 102 is not going to dispose of vehicle 103 for the second/third/fourth/fifth year. Additionally, or alternatively, module 140 may provide a probability density distribution for prospective buyer 102 to dispose of target vehicle 103 in a selected amount of time. FIG. 10 shows an example probability density distribution 1010 (also denoted by ƒ(t), with t being time), with area 1012 denoting probability (calculated as $\int_0^{T_1} f(t)dt$) for prospective buyer 102 of disposing of target vehicle 103 in time $T_1$. In an illustrative embodiment, $T_2$ may be a predicted average time that a buyer may use target vehicle 103 before disposing of it.

In various embodiments, data processing module 140 may generate a vehicle quality score or/and probability density distribution (e.g., 1010) by analyzing reported historical data for sold vehicles and by considering the number of owners of the vehicles. For example, if sold vehicle 155 with a specific historical data may have a large number of owners, with the last owner of vehicle 155 disposing of vehicle 155 within a year of ownership, then for target vehicle 103 that has similar historical data as sold vehicle 155, the same attributes as vehicle 155 and a large number of owners, likelihood that prospective buyer 102 will enjoy the vehicle for a long time is low. In an example embodiment, data processing module 140 may include a computer-based model that may take as an input the reported historical data for vehicle 155, number of owners, and dates when owners bought and sold vehicle 155, including the dates when the last owner bought and sold vehicle 155, and generate a vehicle quality score(s) or/and probability density distribution. In an example embodiment, a computer-based model for generating the vehicle quality score may include machine-learning models, such as neural networks, decision trees, and models based on ensemble methods, such as random forests. The machine-learning models may have parameters that may be selected for optimizing the performance of the computer-based model. For example, parameters specific to a particular type of model (e.g., the number of features and number of layers in a neural network) may be optimized to improve the model's performance. In various embodiments, the computer-based model may be trained using a variety of training data that include reported historical data, the number of owners for the vehicle and dates when owners bought and sold vehicle 155. The computer-based model may be trained in a similar process as described by process 900.

The vehicle quality score may be used to differentiate between the vehicles that have otherwise similar attributes, or/and similar outward appearance or/and similar performance characteristics. In an illustrative embodiment, data processing module 140 may, for a target vehicle 103, obtain a subset of vehicle data related to sold vehicles having a vehicle quality score in a specific range. For example, data 601 may be a subset of data 501 as shown in FIG. 6, when the vehicle quality score for sold vehicles represented by data points 601 is within a range of 80 to 100 or any other suitable range. When data processing module 140 is configured to generate a probability density distribution (e.g., 1010), vehicle quality score (VQS) may be calculated as $VQS=100 \times [1-\int_0^{T_1} f(t)dt]$, where time $T_1$ is chosen as a suitable time (e.g., three years). If, for example, the probability of disposing of target vehicle 103 in three years is small (i.e., $\int_0^{T_1} f(t)dt$ is a small number ranging from zero to ten), VQS may be in a range of 90 to 100.

Figure 11:
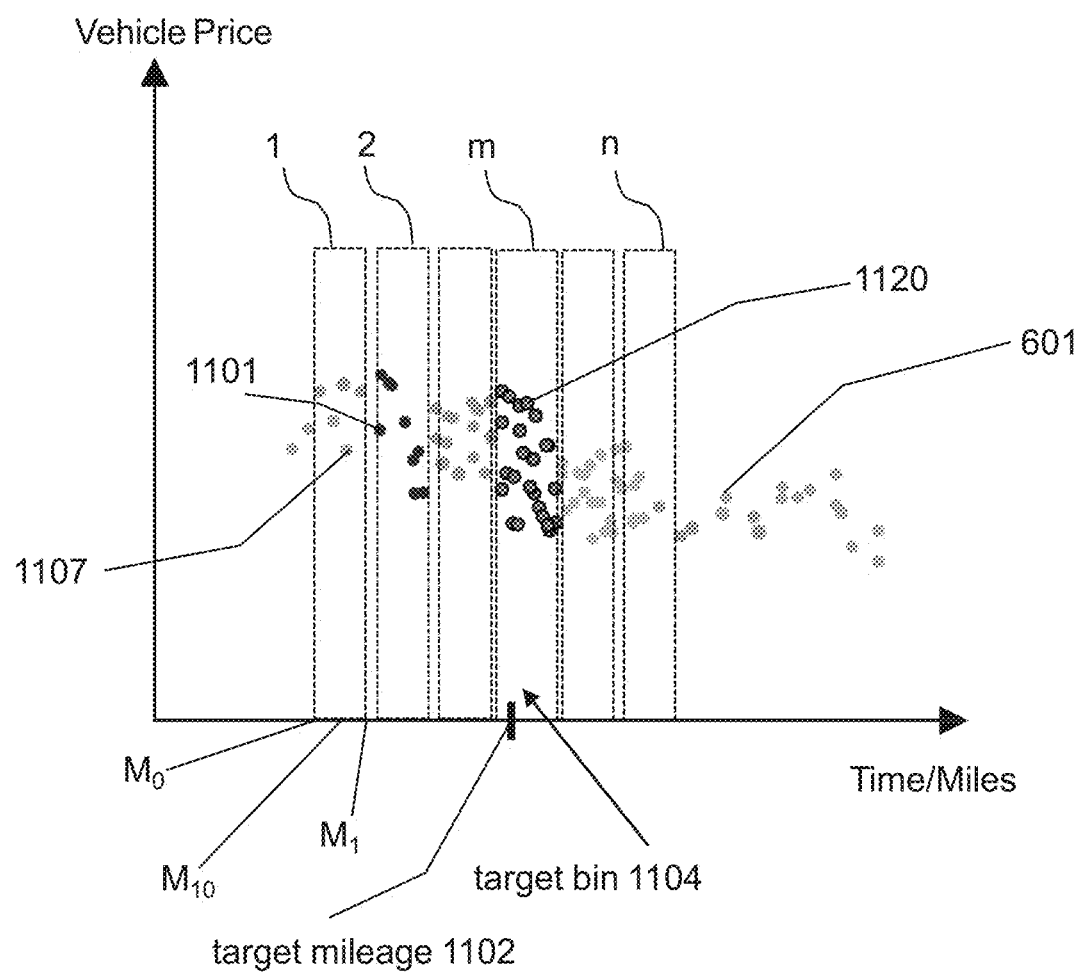
FIG. 11 is a graph showing how vehicle-related data may be separated into bins, consistent with disclosed embodiments.

The linear regression approach is one of the approaches that may be used to generate a target price for target vehicle 103. An alternative approach may involve separating the data for sold vehicles into groups related to different mileage ranges for sold vehicles. FIG. 11 illustrates an example embodiment, where filtered data for sold vehicles 601 is separated into bins (e.g., bins 1, 2, m, and n, as shown in FIG. 11). For example, points 1101 belong to bin 2. In an example embodiment, data processing module 140 may generate a set of non-overlapping mileage ranges with each mileage range corresponding to one of the bins (e.g., bins shown in FIG. 11). For example, bin 1 may have mileage range from $M_0$ to $M_1$ as shown in FIG. 11. Each bin may have a bin label (e.g., bin labels "1", "2", "m", and "n"). A mileage value (e.g., $M_{10}$ shown in FIG. 11) may lie in the mileage range of a bin and identify the mileage range for a bin. For example, a mileage value $M_{10}$ may be mileage in the middle of the bin (i.e., $M_{10}=0.5 (M_0+M_1)$). In an example embodiment, one of the bins (e.g., a target bin 1104) may contain a target mileage 1102 corresponding to the mileage of target vehicle 103.

In various embodiments, data processing module 140 may retrieve or receive sales data (e.g., prices and mileages for sold vehicles) for sold vehicles having attributes corresponding to the target vehicle attributes and associate bin labels with the sold vehicle sales data. As shown in FIG. 11 a bin label, such as bin 1 may be associated with a sold vehicle if a mileage of the sold vehicle is contained in a mileage range corresponding to the bin label. For example, for sold vehicle 155 with data point 1107, the mileage for the sold vehicle is between $M_0$ and $M_1$ and is contained in the mileage range corresponding to the bin 1. In some embodiments, mileage range for a bin may be a few tens of thousands of miles, a few thousands of miles, one thousand miles, a few hundred miles, or less. In an example embodiment, all sold vehicles 1120 with a bin label "m" corresponding to target bin 1104 (bin m) may be selected to obtain a target price for target vehicle 103 with target mileage 1102.

Figure 12:
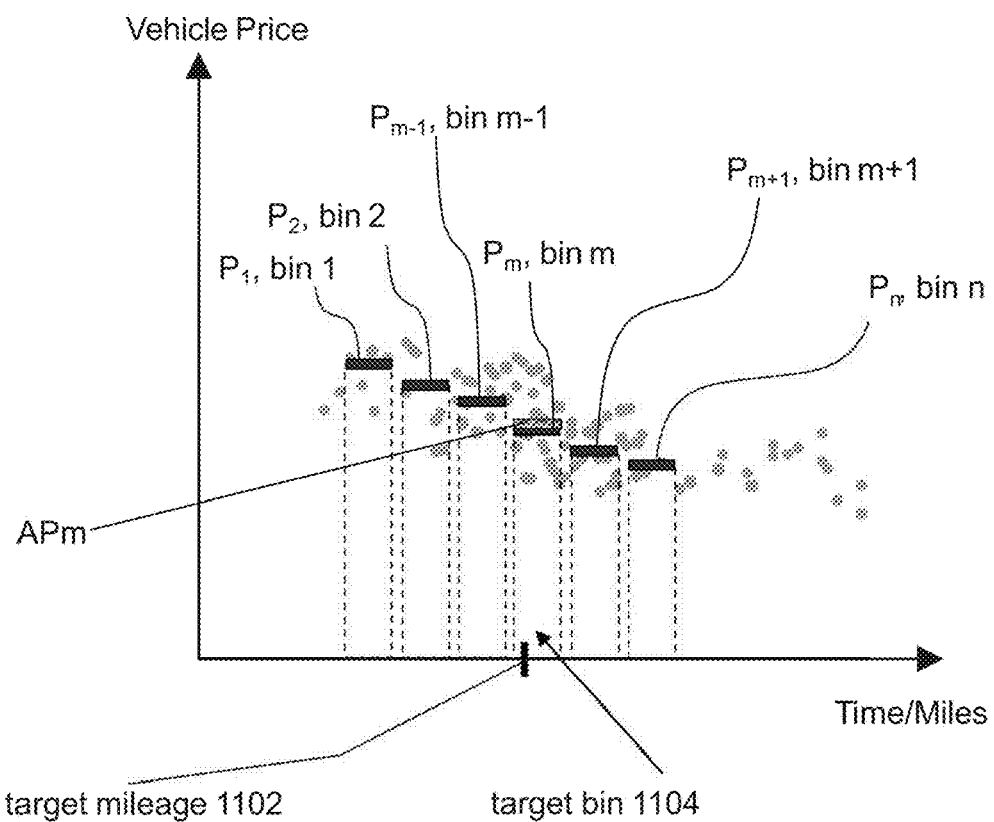
FIG. 12 is a graph of exemplary average prices for sold vehicles computed for different bins, consistent with disclosed embodiments.

In an example embodiment, the target price for target vehicle 103 may be generated by computing an average price by averaging price for sold vehicles 1120 associated with the target bin label. In addition, data processing module 140 may be configured to present prospective buyer 102 with a variety of statistical data such as standard deviation from an average price. In some embodiments, data processing module 140 may be configured to present prospective buyer 102 with average prices calculated for each bin. For example, FIG. 12 shows average prices $P_1$, $P_2$, $P_m$ and $P_n$ corresponding to bins 1, 2, m and n. In some embodiments, a target price for target vehicle 103 may be calculated as a weighted average of bin average prices. For example, module 140 may identify a target bin 1104 (bin m) with an average price $P_m$, surrounding bins (e.g., bin m−1, bin m+1 with corresponding average price $P_{m-1}$ and $P_{m+1}$) and assign weight to the target bin and surrounding bins. In an example embodiment bin weight ($w_k$) for a bin k with mileage ranges ($M_{k0}, M_{k1}$) for target mileage $M_T$ may be calculated using the following expressions: $M_{vk}=(\frac{1}{2})(M_{k0}+M_{k1})$, $\alpha_k=(1+(1-M_{vk}/M_T)^2)^{-1}$, $w_t=\Sigma_k \alpha_k$, $w_k=(\alpha_k/w_t)$.

Figure 13:
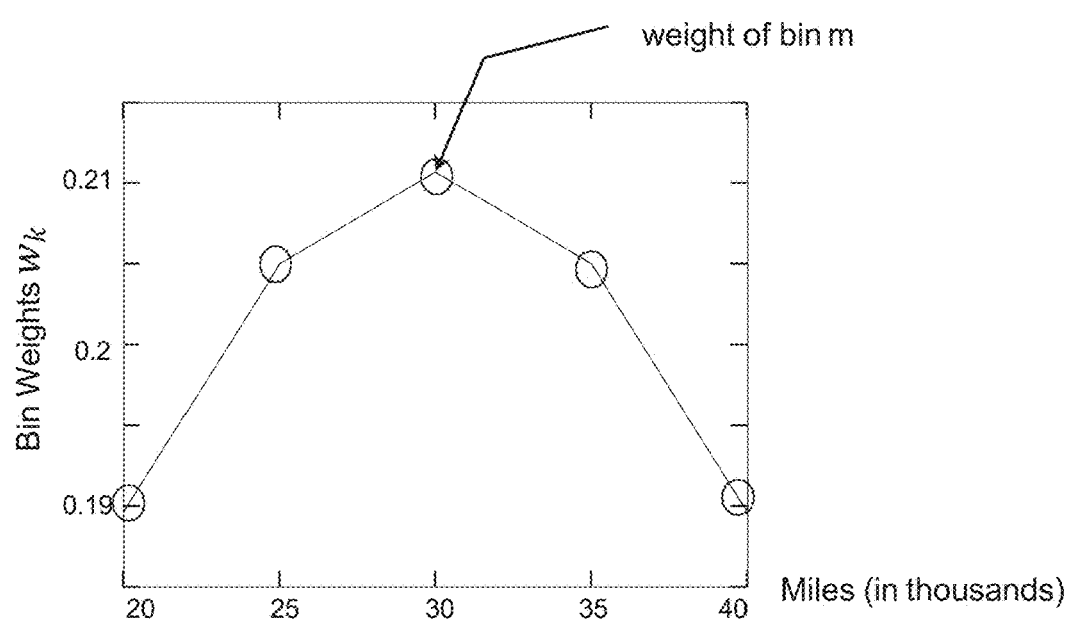
FIG. 13 is a graph of the exemplary distribution of weights for different bins, consistent with disclosed embodiments.

FIG. 13, shows a distribution of bin weights $w_k$, for an example case with $M_T=30{,}000$ miles, and set of values for $M_{Vk}=\{20, 25, 30, 35, 40\} \times 1000$ miles. The weights are inversely proportional to the square of the difference between the target mileage and the mileage value ($M_{vk}$) associated with the bin label k. In various embodiments, the target price (TP) may be calculated as $TP=\Sigma_k w_k P_k$, where $P_k$ is the average price of bin k. It should be noted that weights $w_k$ computed using the above expressions are only illustrative and any other weights $w_k$ may be used. In various embodiments, the bin containing target mileage (e.g., bin m) may have the largest weight, and the sum of all weights may add to unity.

In various embodiments, vehicle system 105 may provide an interface via interface system 130 for prospective buyer 102 for facilitating selection of target vehicle 103 from various vehicles available for sale. In an example embodiment, shown in FIG. 16, the interface may include an interface 1401 that may contain questions and various graphical user elements designed for interacting with data processing module 140 for selecting target vehicle 103 that best fits the needs of prospective buyer 102.

Interface system 130 may be accessed via a web-enabled user access point such as the user's personal computer smart phone, or other device capable of connecting to the Internet. Such a device may have a browser application that may be implemented as a module that uses text, graphics, audio, video, and other media to present data and to allow interaction with data of system 105 via the communications network. The browser application may be implemented to communicate with input devices and may include software with the appropriate interfaces which allow a user to access data through the use of stylized screen elements such as, for example, menus, windows, dialog boxes, toolbars, and controls (for example, radio buttons, check boxes, sliding scales, and so forth). Furthermore, the browser application may communicate with a set of input and output devices to receive signals from the user. The input device(s) may include a keyboard, roller ball, pen and stylus, mouse, trackball, voice recognition system, or pre-designated switches or buttons. The output device(s) may include a speaker, a display screen, a printer, or a voice synthesizer. In addition, a touch screen may act as a hybrid input/output device. In another embodiment, a user may interact with the system more directly such as through a system terminal connected to system 105 without communications over the Internet, a WAN, or LAN, or similar network.

As shown in FIG. 16, interface 1401 may include true/false questions (e.g., a question 1 of interface 1401), questions that require descriptive answers (e.g., a question 2 and a question N of interface 1401), and/or multiple-choice questions (e.g., a question 3 of interface 1401). Above examples of questions are only illustrative, and another type of question may be asked. In an example embodiment, questions may include "Please enter a type of the vehicle you would like to consider, such as sedan, SUV, truck, luxury sports car." Other questions may include prompting prospective buyer 102 to enter preferred attributes for target vehicle such as make, model, trim, age, mileage (or mileage range), engine, the location of vehicle use, the maximum number of previous owners of target vehicle 102, accidents, maintenance history and/or the like. In various embodiments, questions (e.g., question 1, question 2, question 3 through question n as shown in FIG. 16), may be used to construct a data filter for data related to various vehicles available for sale. For example, a question "Please specify a mileage range that you would like to consider for your vehicle," results in data processing module 140 constructing a data filter and using the constructed data filter to select vehicles in the specified mileage range. In some embodiments, for some or all of the questions, prospective buyer 102 may select a measure of importance using, for example, graphical user interface (e.g., a sliding bar 1403 may be used to determine the importance of question 2 as shown in FIG. 16). The upper position of sliding bar 1403 may indicate high importance of the characteristic selected by prospective buyer 102 in question 2, and the low position may indicate the low importance of the characteristic selected by prospective buyer 102 in question 2. In some embodiments, data processing module 140 may use characteristics selected by prospective buyer 102 for filtering data related to vehicles available for sale if the characteristics have high importance. If prospective buyer 102 indicated that selected characteristics are not very important, module 140 may use it as a filtering criterion only if vehicles related to filtered data have similar or lower target prices as compared to target prices of vehicles for unfiltered data. If prospective buyer 102 indicated that characteristics are somewhat important, module 140 might use characteristics as a filtering criterion, however, may expand filtering range when appropriate. For example, if prospective buyer 102 indicated that he/she prefers vehicles with mileage in the range of 25 to 35 thousand miles with characteristics have medium importance, vehicle system may consider characteristics with a mileage range of 15 to 45 thousand miles.

In some embodiments, interface 1401 may provide a graphical user interface for informing the prospective buyer 102 of price(s) of target vehicle(s) 103 as prospective buyer 102 selects different parameters. In some embodiments, price(s) of target vehicle(s) 103 may be indicated by a movable bar 1407 and may appear when prospective buyer 102 enters the sufficient number of parameters for data processing module 140 to select a possible list of target vehicles 103. In an example embodiment, movable bar 1407 may have a top region 1411 indicating the highest priced target vehicle and a bottom region 1412 indicating the lowest priced target vehicle. The target price(s) for target vehicle(s) 103 may be calculated by any of the methods discussed above, such as using linear regression or calculating the average price of sold vehicles corresponding to a target bin for a target mileage.

In an example embodiment, interface 1401 may include a GUI element 1422 that may be a dropdown list used to select various attributes of target vehicle 103. GUI element 1422 may be a menu permanently displayed in interface 1401. In an example embodiments, element 1422 may be used to enter a distance that prospective buyer 102 is willing to travel to purchase target vehicle 103, vehicle age/year (e.g., new or used vehicle, or a year of vehicle 103), make of vehicle 103, model of vehicle 103, trim of vehicle 103, minimum and maximum price of vehicle 103, mileage, additional features (e.g., leather seats, Bluetooth, back camera, etc.), body style (e.g., convertible, sedan, SUV, etc.), exterior color of vehicle 103, interior color of vehicle 103, drivetrain (e.g., four wheel drive), transmission (e.g., manual), engine (e.g., hybrid), fuel type (e.g., diesel), ranges for miles per gallon of fuel, and the like. In some embodiments, various choices may be available as dropdown lists that may be opened or closed by prospective buyer 102 interacting with interface 1401. In some embodiments, interface 1401 may display a list of vehicles 103 along with various related information (e.g., information about the seller of a vehicle, vehicle customer ratings, link to a Carfax report, Vin number, and/or the like) that match attributes selected by prospective buyer 102.

Figure 14:
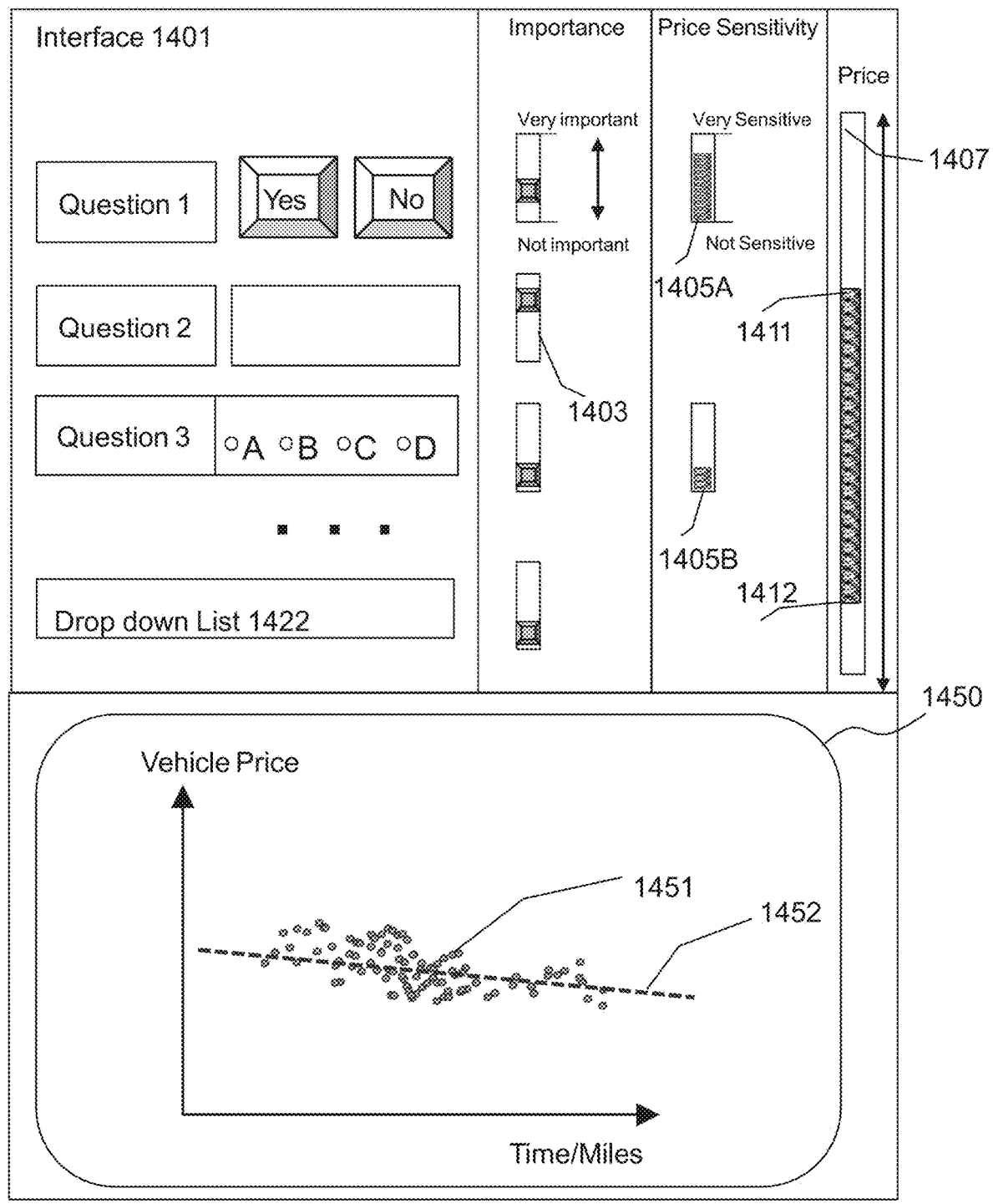
FIG. 14 is an illustration of an exemplary interface that may be used for buying a vehicle, consistent with disclosed embodiments.

In various embodiments, interface 1401 may include graphical user elements for determining a sensitivity of price as a function of the changing characteristics for target vehicle 103, when such sensitivity measure can be performed. For example, for criteria related to four-wheel drive or front wheel drive, system 105 may report how the target price for target vehicle 103 changes when selecting one or the other option. For options such as mileage for target vehicle 103, price sensitivity may indicate how changing the mileage of target vehicle 103 may affect the target price of target vehicle 103. In some cases, changing the mileage of target vehicle 103 by five thousand miles may reduce the target vehicle price by thousands of dollars. FIG. 14, shows movable bars 1405A and 1405B that may indicate price sensitivity to parameters selected by answering corresponding questions Question 1 and Question 3.

In an example embodiment, system 105 may inform prospective buyer 102 on general trends in vehicle transactions. For example, system 105 may provide prospective buyer 102 with information such as types of vehicles are selling well, types of vehicles that are popular, and entire cost of owning target vehicle 103. For example, system 105 may estimate an entire cost for owning a vehicle taking into account financing and predicted vehicle repairs and maintenance. For example, prospective buyer 102 may consider buying a foreign vehicle, but when considering repair and maintenance cost, may opt for a locally produced vehicle.

In some embodiments, system 105 may suggest various prices for the same target vehicle 105 based on prospective buyer 102 financing options. For example, for prospective buyer paying in cash, system 105 may suggest a lower target price (depending on instructions from a seller of a vehicle).

In an example embodiment, interface 1401 may display a graph 1450 illustrating vehicle price data 1451 and a linear regression graph 1452 as a function of target vehicle 103 miles traveled by vehicle 103. For example, graph 1450 may be the graph shown in FIG. 5, or the graphs shown in FIG. 6 or FIG. 7. In some embodiments, graph 1450 may be selectable. For example, prospective buyer 102 may be able to click either on linear regression graph 1452 or on various vehicle price data points 1451 to obtain additional information about target vehicle 130 or about price data points 1451. For example, price data points 1451 may be rated. By clicking on a price data point, prospective buyer 102 may receive a price rating as "good," "fair," "poor," or any other suitable rating. For example, price rating may include a price score, with the highest score being the best price and lowest score being the worst price. In some embodiments, interface 1401 may provide perspective buyer 102 with a choice of viewing other vehicles in the same price category or having the same mileage as target vehicle 130 displayed by graph 1450. For example, interface 1401 may provide perspective buyer 102 with vehicles that have similar prices and mileage as target vehicle 130 but may have a better rating. Additionally, or alternatively, interface 1401 may provide perspective buyer 102 with several graphs 1450 placed side-by-side, where each graph 1450 may be plotted for a vehicle with unique attributes such as make, model, trim, age, mileage (or mileage range), and/or the like. In an example embodiments, vehicle price data points 1451 for vehicles with two different sets of attributes may be plotted on the same graph with vehicle price data points 1451 corresponding to each set of attributes colored by a unique color.

In various embodiments, prospective buyer 102 may communicate with a prospective seller (e.g., a vehicle dealer) of target vehicle 103 via system 105. In an example embodiment, prospective buyer 102 may use the data generated by system 105 (e.g., target price generated by system 105, vehicle quality score, various charts, etc.) to suggest a prospective seller to change the offered price for target vehicle 103. For example, prospective buyer 102 may cite target price generated by system 105 as a fair price and suggest to prospective buyer 102 to accept the target price predicted by system 105. In some embodiments, prospective buyer 102 may apply appropriate filtering techniques (e.g., data filter based on the outward appearance of target vehicle 103) to obtain a target price for target vehicle 103, and communicate the target price for target vehicle 103 to prospective buyer 102.

In various embodiments, in order to facilitate communication between prospective buyer 102 and a prospective seller, system 105 may allow various parties (e.g., prospective buyer 102 and dealership) to maintain a user profile that may include contact information such as electronic means (e.g., email, chat, text message, telephone, fax or telegraph) for communication. In some embodiments, the profile may include user-related information (e.g., user age, gender, occupation, links to friends of the user, links to cars that user such as prospective buyer 102 considers for purchase, etc.)

Figure 15:
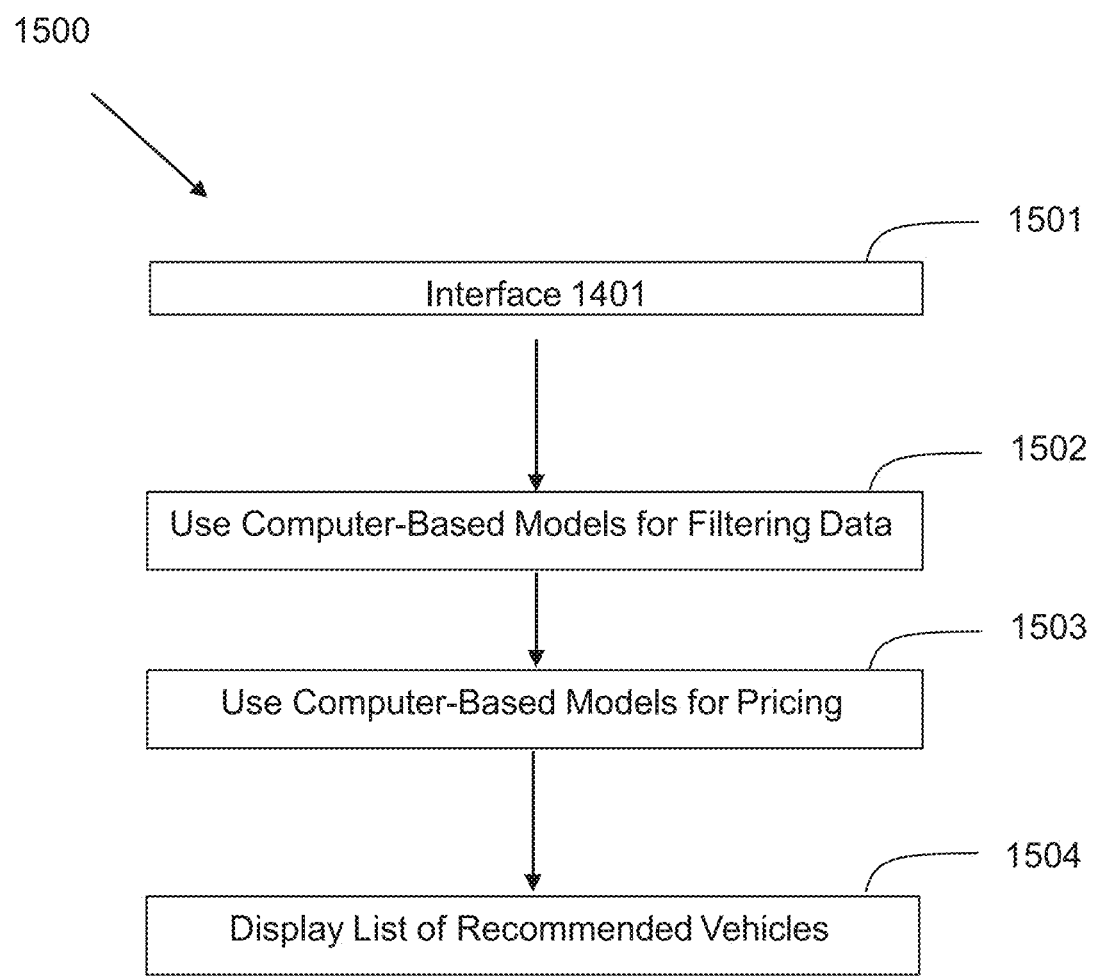
FIG. 15 is a flowchart of an exemplary process of selecting a vehicle, consistent with disclosed embodiments.

FIG. 15 shows a process 1500 of using vehicle data system 105, and interface system 130 to obtain a list of recommended target vehicles. At a step 1501, prospective buyer 102 may choose search parameters via interface 1401. Data from interface 1401 may then be processed by computer-based models at a step 1502. During step 1502, the data from interface 1401 is first used to filter various vehicles available for sale to obtain a list of recommended vehicles. At a step 1503, computer-based models (e.g., 820 shown in FIG. 8) may be used to generate target prices for vehicles in the list of recommended vehicles. In some embodiments, depending on preferences of prospective buyer 102 on the price of target vehicle 103, additional data filters may be applied to only list recommended vehicles that are within the price range preferred by prospective buyer 102. At a step 1504, vehicle system 105 may display a list of recommended vehicles to prospective buyer 102.

The foregoing description has been presented for purposes of illustration. It is not exhaustive and is not limited to precise forms or embodiments disclosed. Modifications and adaptations of the embodiments will be apparent from a consideration of the specification and practice of the disclosed embodiments. For example, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as non-exclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent from a consideration of the specification and practice of the embodiments disclosed herein. It is intended that the specification and examples be considered as an example only, with a true scope and spirit of the disclosed embodiments being indicated by the following claims.

What is claimed is:

1. A method for providing a target price for a target vehicle with a target mileage, the method comprising:
   receiving, via a graphical user interface, attributes for a target vehicle, the attributes including a target mileage for the target vehicle;
   obtaining a plurality of image data corresponding to a plurality of sold vehicles;
   creating a training set, the training set including the plurality of image data and a plurality of match scores, the plurality of match scores including at least a first match score between a first image data of the plurality of image data and a second image data of the plurality of image data, a second match score between the second image data and a third image data of the plurality of image data, and a third match score between the first image data and the third image data;

training a machine learning model based on the training set;
obtaining target vehicle image data of the target vehicle;
determining, via the trained machine learning model, a corresponding match score between the target vehicle image data and each of the plurality of image data;
selecting a subset of the plurality of image data from the plurality of image data, such that the corresponding match score between the target vehicle image data and each of the subset of the plurality of image data is above a threshold score;
selecting a subset of sold vehicles from the plurality of sold vehicles based on the selected subset of the plurality of image data;
retrieving sales data for the subset of sold vehicles having attributes corresponding to the attributes of the target vehicle, the sales data including price data of the subset of sold vehicles and mileage data associated with the subset of sold vehicles;
generating a set of non-overlapping mileage ranges, such that one or more mileage values of the mileage data fall within the mileage ranges and the target mileage falls within the mileage ranges;
associating a corresponding bin label with each mileage range of the set of non-overlapping mileage ranges;
selecting a target bin label associated with a mileage range that includes the target mileage; and
generating a target price for the target vehicle by computing an average price of the price data of the subset of sold vehicles associated with the target bin label, wherein generating the target price comprises:
computing an average price of the price data of the subset of sold vehicles associated with each bin label to create a set of bin average prices;
computing bin weights for the bin labels, wherein the bin weights for the bin labels are computed based on a difference between the target mileage and mileage values associated with the bin labels; and
computing a weighted average of bin average prices using the bin weights.

2. The method of claim 1, wherein a size of any one of the mileage ranges is less than one thousand miles.

3. The method of claim 1, wherein the bin weights are inversely proportional to a square of the difference between the target mileage and the mileage values associated with the bin labels.

4. The method of claim 1, further comprising applying a data filter to attributes of the plurality of sold vehicles to create another subset of sold vehicles.

5. The method of claim 4, wherein applying the data filter comprises filtering the plurality of sold vehicles by a quality score.

6. The method of claim 4, wherein applying the data filter comprises filtering the plurality of sold vehicles by a match score.

7. The method of claim 4, wherein applying the data filter comprises filtering the plurality of sold vehicles by one of a year, a make, a model, or a trim line.

8. The method of claim 1, wherein the attributes of the target vehicle comprise a history of location data for the target vehicle.

9. The method of claim 8, wherein the attributes of the target vehicle comprise a history of weather data corresponding to the location data history for the target vehicle.

10. The method of claim 1, wherein the attributes of the subset of sold vehicles comprise a history of location data for the subset of sold vehicles, and the method further comprising applying a data filter to the plurality of sold vehicles by a location of vehicle use.

11. The method of claim 1, further comprising:
receiving a suggested price for the target vehicle; and
generating a target score based on a difference between the suggested and the target price.

12. The method of claim 1, further comprising:
obtaining first additional image data, second additional image data, and an additional match score between the first additional image data and the second additional image data;
predicting, via the trained machine learning model, a match score between the first additional image data and the second additional image data;
comparing the predicted match score to the additional match score; and
modifying model parameters of the machine learning model when a difference between the predicted match score and the additional match score is above a threshold value.

13. The method of claim 1, further comprising:
displaying the graphical user interface, the graphical user interface including a linear regression graph including a plurality of data points corresponding to the price data of the subset of sold vehicles and the mileage data associated with the subset sold vehicles; and
in response to a selection of a data point from the plurality of data points on the linear regression graph, overlaying additional information associated with a corresponding sold vehicle associated with the selected data point over the linear regression graph and in response to another selection of another data point from the plurality of data points on the linear regression graph, overlaying other additional information associated with a corresponding sold vehicle associated with the other selected data point over the linear regression graph.

14. A system for providing a target price for a target vehicle with a target mileage, the system comprising at least one memory storing instructions and at least one processor executing the instructions to perform operations comprising:
receiving, via a graphical user interface, attributes for a target vehicle, the attributes including a target mileage for the target vehicle;
obtaining a plurality of image data corresponding to a plurality of sold vehicles;
creating a training set, the training set including the plurality of image data and a plurality of match scores, the plurality of match scores including at least a first match score between a first image data of the plurality of image data and a second image data of the plurality of image data, a second match score between the second image data and a third image data of the plurality of image data, and a third match score between the first image data and the third image data;
training a machine learning model based on the training set;
obtaining target vehicle image data of the target vehicle;
determining, via the trained machine learning model, a corresponding match score between the target vehicle image data and each of the plurality of image data;
selecting a subset of the plurality of image data from the plurality of image data, such that the corresponding match score between the target vehicle image data and each of the subset of the plurality of image data is above a threshold score;

selecting a subset of sold vehicles from the plurality of sold vehicles based on the selected subset of the plurality of image data;

retrieving sales data for the subset of sold vehicles having attributes corresponding to the attributes of the target vehicle, the sales data including price data of the subset of sold vehicles and mileage data associated with the subset of sold vehicles;

generating a set of non-overlapping mileage ranges, such that one or more mileage values of the mileage data fall within the mileage ranges and the target mileage falls within the mileage ranges;

associating a corresponding bin label with each mileage range of the set of non-overlapping mileage ranges;

selecting a target bin label associated with a mileage range that includes the target mileage; and generating a target price for the target vehicle by computing an average price of the price data of the subset of sold vehicles associated with the target bin label, wherein generating the target price comprises:

computing an average price of the price data of the subset of sold vehicles associated with each bin label to create a set of bin average prices;

computing bin weights for the bin labels, wherein the bin weights for the bin labels are computed based on a difference between the target mileage and mileage values associated with the bin labels; and computing a weighted average of bin average prices using the bin weights.

15. The system of claim 14, wherein a size of any one of the mileage ranges is less than one thousand miles.

16. The system of claim 14, wherein the bin weights are inversely proportional to a square of the difference between the target mileage and the mileage values associated with the bin labels.

17. The system of claim 14, further comprising applying a data filter to attributes of the plurality of sold vehicles to create another subset of sold vehicles.

18. The system of claim 17, wherein applying the data filter comprises filtering the plurality of sold vehicles by a quality score.

19. The system of claim 17, wherein applying the data filter comprises filtering the plurality of sold vehicles by a match score.

20. The system of claim 17, wherein applying the data filter comprises filtering the plurality of sold vehicles by one of a year, a make, a model, or a trim line.

21. The system of claim 14, wherein the attributes of the target vehicle comprise a history of location data for the target vehicle.

22. The system of claim 14, wherein the graphical user interface comprises:

a linear regression graph showing prices of the subset of sold vehicles and the target price;

at least one input field for receiving the attributes of the target vehicle; and at least one graphical user interface element for determining importance of at least one of the attributes of the target vehicle.

\* \* \* \* \*